(12) United States Patent
Chong et al.

(10) Patent No.: US 12,087,357 B2
(45) Date of Patent: Sep. 10, 2024

(54) MULTI-PORT MEMORY ARCHITECTURE

(71) Applicant: Arm Limited, Cambridge (GB)

(72) Inventors: Yew Keong Chong, Austin, TX (US); Sriram Thyagarajan, Austin, TX (US); Andy Wangkun Chen, Austin, TX (US); Arjun Singh, Bangalore (IN); Ayush Kulshrestha, New Delhi (IN)

(73) Assignee: Arm Limited, Cambridge (GB)

( * ) Notice: Subject to any disclaimer, the term of this patent is extended or adjusted under 35 U.S.C. 154(b) by 144 days.

(21) Appl. No.: 17/844,551

(22) Filed: Jun. 20, 2022

(65) Prior Publication Data

US 2023/0410896 A1    Dec. 21, 2023

(51) Int. Cl.
  *G11C 11/412*  (2006.01)
  *G11C 11/419*  (2006.01)

(52) U.S. Cl.
  CPC .......... *G11C 11/419* (2013.01); *G11C 11/412* (2013.01)

(58) Field of Classification Search
  CPC .............................. G11C 11/412; G11C 11/419
  USPC .......................................................... 365/154
  See application file for complete search history.

(56) References Cited

U.S. PATENT DOCUMENTS

| | | | | |
|---|---|---|---|---|
| 9,311,990 | B1* | 4/2016 | Rawat | G11C 8/16 |
| 10,978,141 | B1* | 4/2021 | Chong | G11C 11/418 |
| 11,348,624 | B1* | 5/2022 | Walke | G11C 7/1075 |
| 2010/0306475 | A1* | 12/2010 | Hooker | G06F 12/0831 |
| | | | | 711/170 |
| 2012/0051131 | A1* | 3/2012 | Liu | G11C 11/413 |
| | | | | 365/185.05 |
| 2012/0140552 | A1* | 6/2012 | Seikh | G11C 11/412 |
| | | | | 365/156 |
| 2013/0258757 | A1* | 10/2013 | Iyer | G11C 11/419 |
| | | | | 365/154 |
| 2014/0281284 | A1* | 9/2014 | Block | G11C 5/04 |
| | | | | 711/149 |
| 2015/0357009 | A1* | 12/2015 | Sinangil | H10B 10/12 |
| | | | | 365/156 |
| 2019/0080737 | A1* | 3/2019 | Nguyen | G11C 8/08 |
| 2020/0020383 | A1* | 1/2020 | Fujiwara | H01L 21/4889 |
| 2021/0118477 | A1* | 4/2021 | Bringivijayaraghavan | |
| | | | | G11C 7/1066 |
| 2022/0343970 | A1* | 10/2022 | Mathur | G11C 11/412 |

FOREIGN PATENT DOCUMENTS

| | | | | | |
|---|---|---|---|---|---|
| GB | | 2542214 A | * | 3/2017 | .......... G06F 11/2221 |
| JP | | 2004348916 A | * | 12/2004 | .......... G06F 12/0893 |
| WO | WO-03081423 | A1 | * | 10/2003 | .......... G06F 15/8053 |
| WO | WO-2019206074 | A1 | * | 10/2019 | .......... G11C 11/4074 |
| WO | WO-2022203970 | A1 | * | 9/2022 | .......... G06F 12/0284 |

* cited by examiner

*Primary Examiner* — Ly D Pham

(74) *Attorney, Agent, or Firm* — Pramudji Law Group PLLC; Ari Pramudji

(57) ABSTRACT

Various implementations described herein are directed to a device having memory circuitry having multi-port bitcells, wherein each bitcell of the multi-port bitcells has a read-write port and a read port. The device may have read-write circuitry coupled to the read-write port, wherein the read-write circuitry has write-drive logic and read-sense logic that provide for at least one write and at least one read in a single clock cycle.

20 Claims, 7 Drawing Sheets

MULTI-PORT MEMORY ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit architecture, conventional single-port based memory devices use traditional memory access techniques to perform read-write operations and thus may suffer from unintended conflicts when attempting to access multiple memory banks. Thus, to avoid these conflicts, some modern memory designs have increased a number of read ports to improve performance; however, this increase in the number of read ports typically results in similar consequences with higher chances of access conflicts in multiple bank memory designs, which adversely impacts performance when frequent conflicts occur in these applications. Also, to further avoid these conflicts, some modern memory designs have increased a number of memory banks; however, an increase in the number of banks typically splits larger memory banks into smaller banks for more banking, which adversely impacts layout efficiency since smaller memory banks are area inefficient. This can result in power, performance and area (PPA) penalties for splitting banked memory into more, smaller banks in these applications. Thus, some conventional memory layout techniques and applications have reduced performance capabilities, are relatively inefficient, density deficient and typically fail to provide sufficient means for reducing access conflicts. Thus, there exists a need to improve memory layout techniques that allow for efficient memory access and that improves power, performance and area (PPA) of modern designs.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein provide high performance schemes and techniques for multi-port memory architecture in various physical layout designs and applications. In various implementations, schemes and techniques described herein are directed to high performance multi-port memory architecture for high performance cache architecture for various CPU applications involving one read and one read-write (1R1RW) memory architecture. In some applications, various schemes and techniques described herein provide for a novel multi-port custom memory architecture that enables CPU cache architecture to perform multiple loads in one clock cycle. Therefore, various schemes and techniques described herein provide for a novel multi-port 1R1RW memory architecture for CPU cache applications that perform multiple loads to improve performance. In some applications, by adding another sense amplifier (SA) to the write-port, this novel memory architecture may be configured to allow 2-Reads or 1Read-1Write in one clock cycle so as to improve read bandwidth without introducing memory access conflict.

Various implementations of high performance multi-port memory schemes and techniques will be described herein with reference to FIGS. 1-7.

Figure 1:
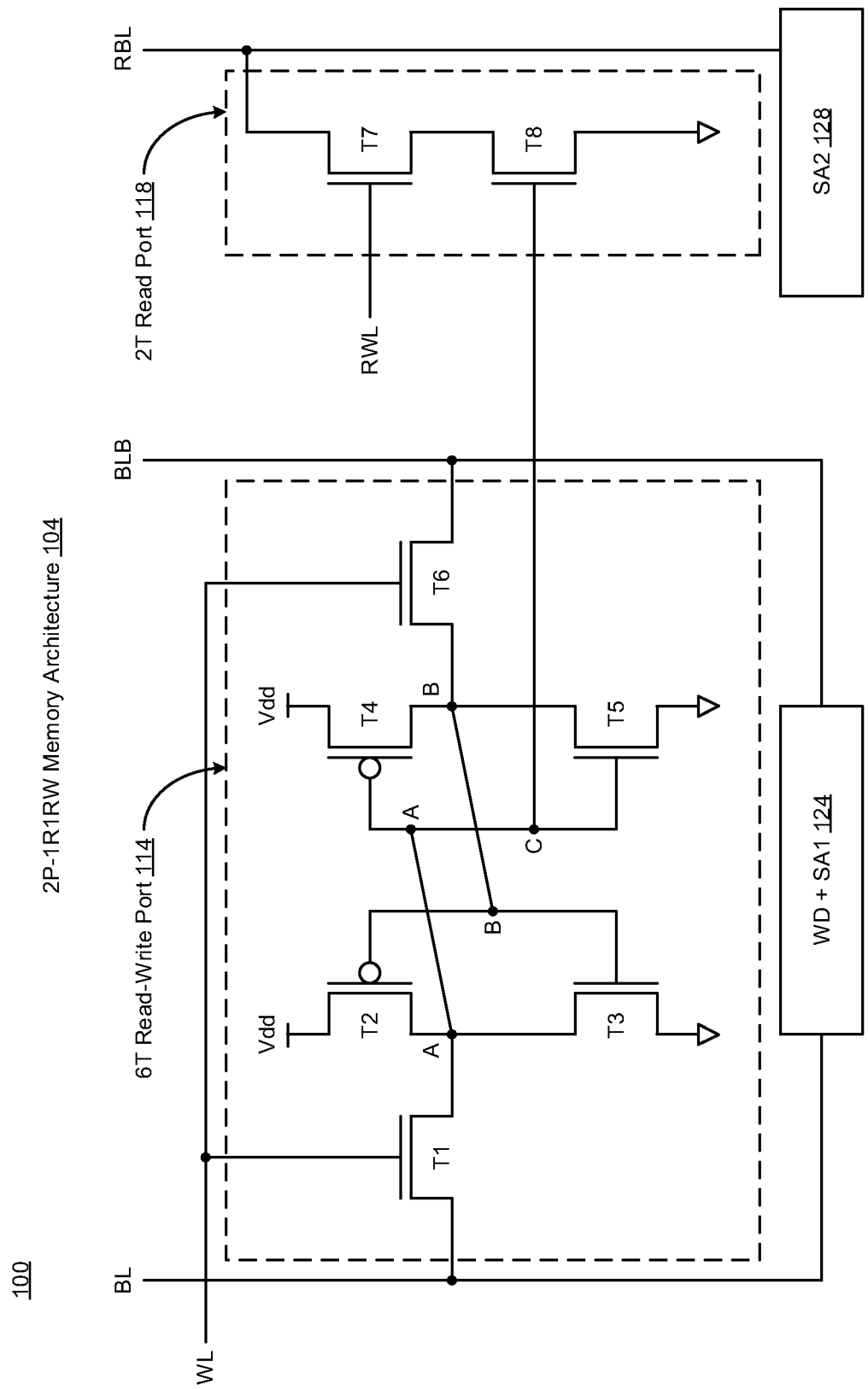
FIG. 1 illustrates a schematic diagram of memory architecture in accordance with various implementations described herein.

FIG. 1 illustrates a schematic diagram 100 of memory architecture 104 having a dual port (2P) one read and one read-write (1R1RW) configuration in accordance with various implementations described herein. In some applications, the memory architecture 104 may refer to an 8-transistor (8T) dual-port bitcell architecture having a six-transistor (6T) read-write port structure 114 with a two-transistor (2T) read port structure 118.

In various implementations, the memory architecture 104 may be implemented as a system or device having various integrated circuit (IC) components that are arranged and coupled together as an assemblage or combination of parts that provide for physical circuit designs and various related structures. In some instances, a method of designing, providing and fabricating the memory architecture 104 as an integrated system or device may involve use of various IC circuit components described herein so as to implement fabrication schemes and techniques associated therewith. Also, the memory architecture 104 may be integrated with computing circuitry and related components on a single chip, and the memory architecture 104 may be implemented in various embedded systems for automotive, electronic, mobile, server and Internet-of-things (IoT) applications.

As shown in FIG. 1, the memory architecture 104 may include memory bitcell structures 114, 118, such as, e.g., the multi-transistor bitcell structure 114 for a read-write port and the multi-transistor bitcell structure 118 for a read-port. In some implementations, the first bitcell structure 114 may be configured as the six-transistor (6T) read-write port structure with the read-write port, and the second bitcell structure 118 may be configured as the two-transistor (2T) read port structure as the read port. Thus, combination of bitcell structures 114, 118 refer to the 8T dual-port memory architecture 104 for various memory applications, including, e.g., static random access memory (SRAM) applications.

In some implementations, the six-transistors (6T) of the 6T bitcell structure 114 may have multiple (e.g., 4) N-type metal-oxide-semiconductor (NMOS) transistors along with multiple (e.g., 2) P-type MOS (PMOS) transistors. In various scenarios, a passgate transistor (T1) is coupled between a first bitline (BL) and node (A), and another passgate transistor (T6) is coupled between a second bitline (BLB) and node (B). Also, the second bitline (BLB) is complementary to the first bitline (BL). The wordline (WL) may be coupled to gates of transistors (T1, T6) to access data stored in the latch formed with transistors (T2, T3, T4, T5) via the wordline (WL) and complementary bitlines (BL, BLB). Transistors (T2, T3) are coupled in series between the voltage supply (Vdd) and ground (Gnd or Vss), wherein node (A) is formed between pull-up transistor (T2) and pull-down transistor (T3). Also, transistors (T4, T5) are coupled in series between voltage supply (Vdd) and ground (Gnd or Vss), wherein node (B) is formed between pull-up transistor (T4) and pull-down transistor (T5). Transistors (T2, T3) are cross-coupled with transistors (T4, T5) such that node (A) is coupled to gates of transistors (T4, T5) and such that node (B) is coupled to gates of transistors (T2, T3). In various instances, transistors (T2, T4) may refer to P-type field-effect transistors (PFET), and further, transistors (T1, T3, T5, T6) may refer to N-type FET (NFET) transistors. However, various other configurations may be used to achieve similar results, characteristics and/or behavior.

In some implementations, the two-transistors (2T) of the 2T read port 118 may include multiple (e.g., 2) N-type MOS (NMOS) transistors. Also, in some scenarios, a first passgate transistor (T7) is coupled between the read bitline (RBL) and a second passgate transistor (T8), and also, the second passgate transistor (T8) is coupled between the first passgate transistor (T7) and ground (Gnd or Vss). The read wordline (RWL) is coupled to the gate of the first passgate transistor (T7), and also, node (C) is coupled to the gate of the second passgate transistor (T8), wherein node (C) refers to node (A).

In some implementations, the 8T dual-port memory architecture 104 as shown in FIG. 1 may be configured to provide for 1-read and 1-read-write (1R1RW) as the dual port (2P) 1-read and 1-read-write (1R1RVV) memory architecture. In some applications, the 2P-1R1RW memory architecture 104 includes read-write circuitry coupled to the read-write port 114, and also, the read-write circuitry has write-drive logic 124 and read-sense logic 128 that may provide for at least one write and at least one read in one clock cycle or single clock cycle. The write-drive logic 124 may include a write driver (WD) and a first sense amplifier (SA1) that provide for write operations and read operations, and also, the read-sense logic 128 may include a second sense amplifier (SA2) that provides for read operations. In some scenarios, by adding the SA1 to the write-drive logic 124, 2P-1R1RW memory 104 may be configured to allow 2Reads or 1Read1Write in one clock cycle, which may improve read bandwidth without introducing memory access conflict. Also, in various CPU applications, the 2P-1R1RW memory architecture 104 may be used for L1D cache architecture designs so as to improve CPU power, performance and area (PPA).

In various implementations, the memory architecture 104 may be implemented with one or more core arrays of memory cells (or bitcells), wherein each memory cell may be configured to store at least one data-bit value (e.g., data value related to a logical '0' or '1'). The one or more core arrays may have any number of bitcells arranged in various configurations, such as, e.g., two-dimensional (2D) memory arrays having any number of columns and any number of rows of multiple bitcells, which may be arranged in a 2D grid pattern for multi-read and write memory access. However, even though an SRAM bitcell structure is shown and described in FIG. 1, any other type of volatile memory structure may be used to achieve similar results in manner as described herein.

In some implementations, the memory architecture 104 may refer to multi-port (2P-1R1RW) memory circuitry having multi-port bitcells with each bitcell of the multi-port bitcells having one read (1R) port and one read-write (1RW) port. The memory circuitry may have read-write circuitry coupled to the one read-write (1RW) port, wherein the read-write circuitry has write-drive logic (WD) and read-sense logic (SA1, SA2) that provide for at least one write (1 W) and at least one read (1R) in a single clock cycle. The write-drive logic (WD) and the read-sense logic (SA1, SA2) may provide for multiple reads in the single clock cycle. In some applications, the read-write port may have first port transistors configured to use the read-sense logic to perform a first read of the multiple reads in the single clock cycle, and also, the read port may have second port transistors configured to perform a second read of the multiple reads in a single clock cycle. In some applications, the read-write port may have first port transistors that are configured to use the write-drive logic to perform the at least one write in the single clock cycle, and also, the read port may have second port transistors that are configured to perform the at least one read in the single clock cycle. Also, in various applications, the memory circuitry may be configured for use with a cache memory architecture in computing applications involving a central processing unit (CPU), and the multi-port bitcells may be static random access memory (SRAM) bitcells that are configured for dual-port memory applications.

Figure 2:
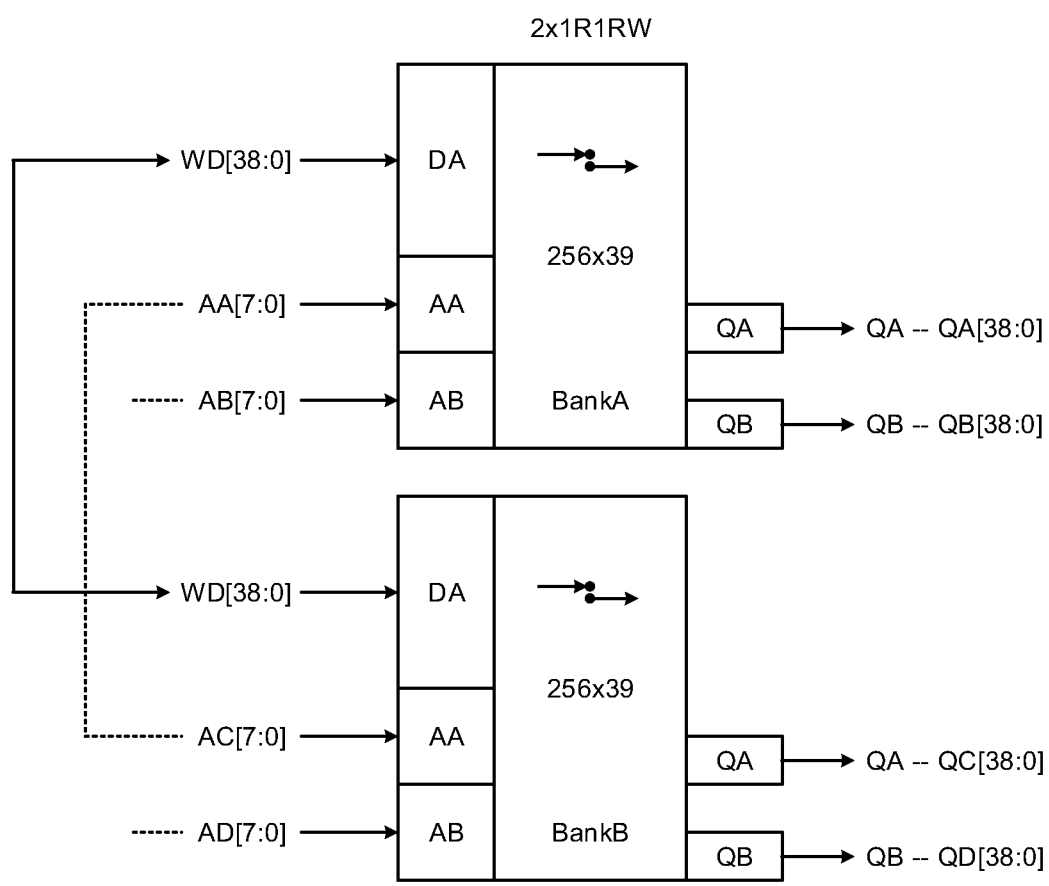
FIGS. 2-3 illustrate diagrams of multi-port memory architecture in accordance with various implementations described herein.
Figure 3:
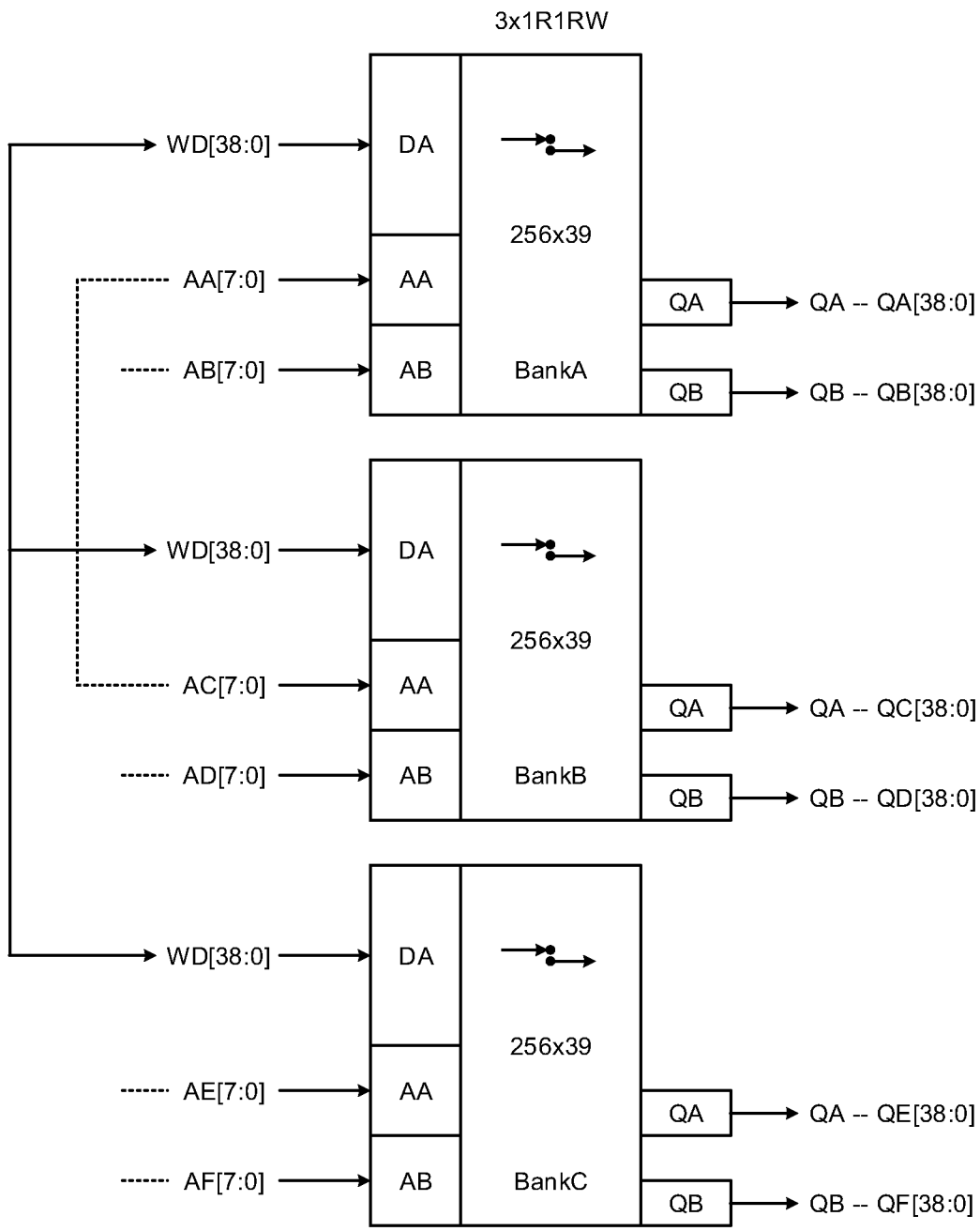

FIGS. 2-3 illustrate diagrams of multi-port memory architecture in accordance with various implementations described herein. In particular, FIG. 2 shows a 2×1R1RW multi-port memory architecture 204, and FIG. 3 shows a 3×1R1RW multi-port memory architecture 304 in accordance with various implementations described herein.

As shown in FIG. 2, the 2×1R1RW multi-port memory architecture 204 may include a first bank (BankA) and a second bank (BankB), wherein BankA may include a first core array of 1R1RW bitcells, and wherein BankB may include a second core array of 1R1RW bitcells. For instance, BankA may include a first core array of 256×39 1R1RW bitcells, and BankB may include a second core array of 256×39 1R1RW bitcells. In some instances, each core array of 256×39 1R1RW bitcells may include dual-port 2P-1R1RW bitcells with PortA as a read port (R) and PortB as a Read/Write (RW) port. Also, in some instances, when global write enable signal (GWEN) for PortB equals zero (i.e., GWEN=0), then a write operation is performed using the PortB address, and when global write enable signal (GWEN) for PortB equals one (i.e., GWEN=1), then a read operation is performed using the PortB address, such that when GWENB=1, ReadB uses PortB address.

In various implementations, the 2×1R1RW multi-port memory architecture 204 may include two (2) standalone 1R1RW core memory arrays with each having 2P-1R1RW bitcells that utilize four (4) sets of addresses (AA, AB, AC, AD) along with a write data bus (WD) and four (4) read buses (QA, QB, QC, QD). In some instances, the write data bus (WD) provides 39-bit data to PortA data bus (DA) of the multi-bank architecture (BankA, BankB) with two (2) sets of 8-bit addresses (AA, AB) provided to address buses (AA, AB) of first bank (BankA) and with two (2) sets of 8-bit addresses (AC, AD) provided to address buses (AA, AB) of second bank (BankB). In some instances, two (2) read buses (QA, QB) of first bank (BankA) provide two sets of 39-bit read data QA, QB as output data QA, QB, respectively, and also, two (2) read buses (QA, QB) of second bank (BankB) provide 39-bit read data QA, QB as output data QC, QD, respectively.

As shown in FIG. 3, the 3×1R1RW multi-port memory architecture 304 may include a first bank (BankA), a second bank (BankB) and a third bank (BankC), wherein BankA may include a first core array of 1R1RW bitcells, and wherein BankB may include a second core array of 1R1RW bitcells, and wherein BankC may include a third core array of 1R1RW bitcells. For instance, BankA may include a first core array of 256×39 1R1RW bitcells, BankB may include a second core array of 256×39 1R1RW bitcells, and BankC may include a third core array of 256×39 1R1RW bitcells. In some instances, each core array of 256×39 1R1RW bitcells may include dual-port 2P-1R1RW bitcells with PortA as a read port (R), PortB as a Read/Write (RW) port, and PortC as another Read/Write (RW) port. In some instances, when global write enable signal (GWEN) for PortB/PortC equals zero (GWEN=0), then write operations may be performed using PortB/PortC addresses, and when global write enable signal (GWEN) for PortB/PortC equals one (GWEN=1), then a read operation may be performed using the PortB/PortC addresses, such that when GWENB=1, ReadB uses PortB address and/or ReadC uses PortC address.

In various implementations, the 3×1R1RW multi-port memory architecture 304 may include two (2) standalone 1R1RW core memory arrays with each having 2P-1R1RW bitcells that utilize six (4) sets of addresses (AA, AB, AC, AD, AE, AF) along with a write data bus (WD) and six (4) read buses (QA, QB, QC, QD, QE, QF). In some instances, the write data bus (WD) provides 39-bit data to PortA data bus (DA) of multi-bank architecture (BankA, BankB, BankC) with two (2) sets of 8-bit addresses (AA, AB) provided to address buses (AA, AB) of first bank (BankA), two (2) sets of 8-bit addresses (AC, AD) provided to address buses (AA, AB) of second bank (BankB), and two (2) sets of 8-bit addresses (AE, AF) provided to address buses (AA, AB) of third bank (BankC). In some instances, two (2) read buses (QA, QB) of first bank (BankA) provide two sets of 39-bit read data QA, QB as output data QA, QB, respectively, and also, two (2) read buses (QA, QB) of second bank (BankB) provide 39-bit read data QA, QB as output data QC, QD, respectively, and also, two (2) read buses (QA, QB) of third bank (BankC) provide 39-bit read data QA, QB as output data QE, QF, respectively.

In some implementations, the memory architecture 204, 304 may refer to multi-port (4P-3R1RW) memory circuitry having multi-port bitcells with each bitcell of the multi-port bitcells having three or more read (3R) ports and one read-write (1RW) port. Further, the memory circuitry may have read-write circuitry coupled to the read-write (1RW) port, and the read-write circuitry may have write-drive logic and read-sense logic that provide for at least one write (1 W) and three or more reads (3R) in a single clock cycle. The write-drive logic and the read-sense logic may be configured to provide for multiple reads in the single clock cycle. In some applications, the read-write port may have first port transistors that are configured to use the read-sense logic to perform first reads of the multiple reads in the single clock cycle, and also, the read port may have second port transistors that are configured to perform second reads of the multiple reads in the single clock cycle. Further, in some applications, the read-write port may have first port transistors that are configured to use the write-drive logic to perform the at least one write in the single clock cycle, and the read port may have second port transistors that are configured to perform the three or more reads in the single clock cycle. Also, in various applications, the memory circuitry may be configured for use with a cache memory architecture in computing applications involving a central processing unit (CPU), and the multi-port bitcells may be SRAM bitcells that are configured for dual-port memory applications.

Figure 4:
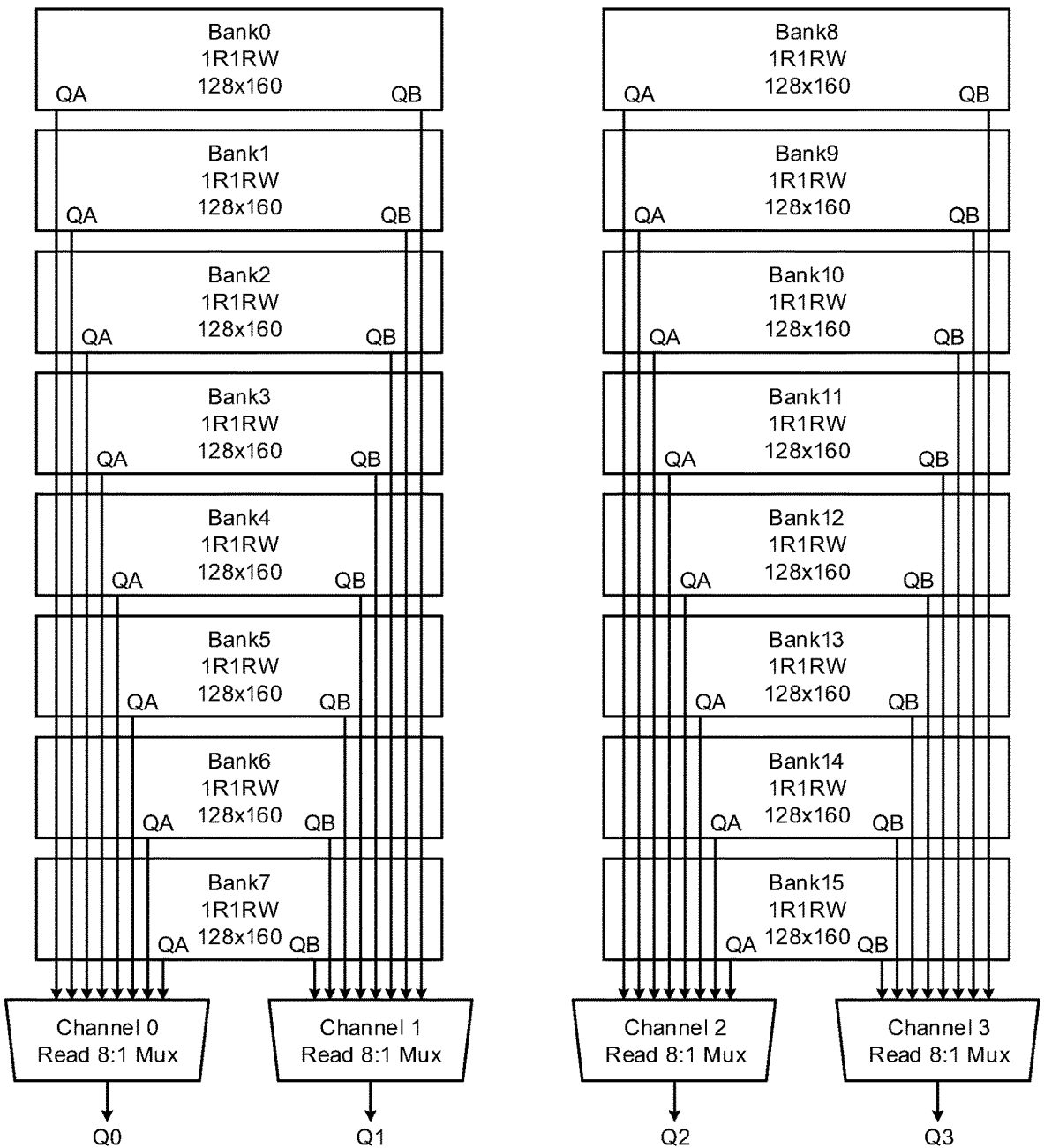
FIG. 4 illustrates a diagram of multi-bank memory architecture in accordance with various implementations described herein.

FIG. 4 illustrates a schematic diagram 400 of multi-bank memory architecture 404 in accordance with various implementations described herein.

As shown in FIG. 4, the 16×1R1RW multi-bank memory architecture 204 may have first multi-bank set (Bank0, Bank1, . . . , Bank7) and second multi-bank set (Bank8, Bank9, . . . , Bank15), wherein the first multi-bank set may include multiple core arrays of 2P-1R1RW bitcells, and wherein the second multi-bank set may also include multiple core arrays of 2P-1R1RW bitcells. For instance, each bank (Bank0, Bank1, . . . , Bank7) in the first multi-bank set may include multiple core arrays of 128×160 1R1RW bitcells, and each bank (Bank8, Bank9, . . . , Bank15) in the second multi-bank set may include multiple core arrays of 128×160 1R1RW bitcells. Also, in some instances, each core array of 128×160 1R1RW bitcells have dual-port 2P-1R1RW bitcells with output ports (QA, QB) coupled to multiple multiplexed channels (Channel 0, Channel 1, Channel 2, Chanel 3) that provide read output data (Q0, Q1, Q2, Q3), respectively.

In some implementations, the output port (QA) of each bank (Bank0, Bank1, . . . , Bank7) in the first multi-bank set may be coupled to a first channel (Channel 0) by way of a first multiplexer (Read 8:1 Mux) to provide read output data (Q0). Also, the output port (QB) of each bank (Bank0, Bank1, . . . , Bank7) in the first multi-bank set may be coupled to a second channel (Channel 1) by way of a second multiplexer (Read 8:1 Mux) to provide read output data (Q1). Also, the output port (QA) of each bank (Bank8, Bank9, . . . , Bank15) in the second multi-bank set may be coupled to a third channel (Channel 2) by way of a third multiplexer (Read 8:1 Mux) to provide read output data (Q2). Also, the output port (QB) of each bank (Bank8, Bank9, . . . , Bank15) in the second multi-bank set may be coupled to a fourth channel (Channel 3) by way of a fourth multiplexer (Read 8:1 Mux) to provide read output data (Q3).

In some implementations, the multi-bank memory architecture 404 may refer to a multi-bank memory device having multiple banks with each bank of the multiple banks having multi-port bitcells. In some applications, each bitcell of the multi-port bitcells may have one read (1R) port and one read-write (1RW) port, and also, each bitcell of the multi-port bitcells may have read-write logic that is coupled to the read-write port of each bitcell, wherein the read-write logic includes write-drive logic and read-sense logic that provide for at least one read and at least one write in a single clock cycle for each bitcell. In some applications, the write-drive logic and the read-sense logic may provide for multiple reads in the single clock cycle for each bitcell, and also, the read-write port for each bitcell may have first port transistors that are configured to use the read-sense logic to perform a first read of the multiple reads in the single clock cycle, and also, the read port for each bitcell may have second port transistors that are configured to perform a second read of the multiple reads in the single clock cycle. Also, in some applications, the read-write port for each bitcell may have first port transistors that are configured to use the write-drive logic to perform the at least one write in the single clock cycle, and in addition, the read port for each bitcell may have second port transistors that are configured to perform the at least one read in the single clock cycle.

Figure 5:
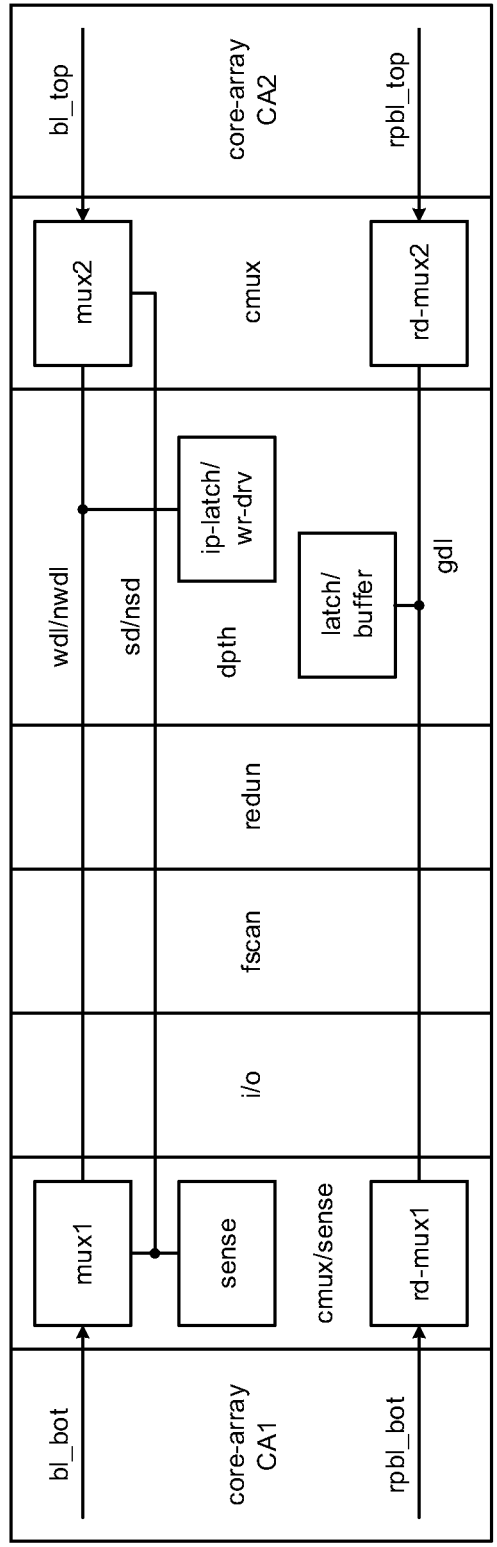
FIGS. 5-7 illustrate various diagrams of flexible-bank memory architecture in accordance with various implementations described herein.
Figure 6:
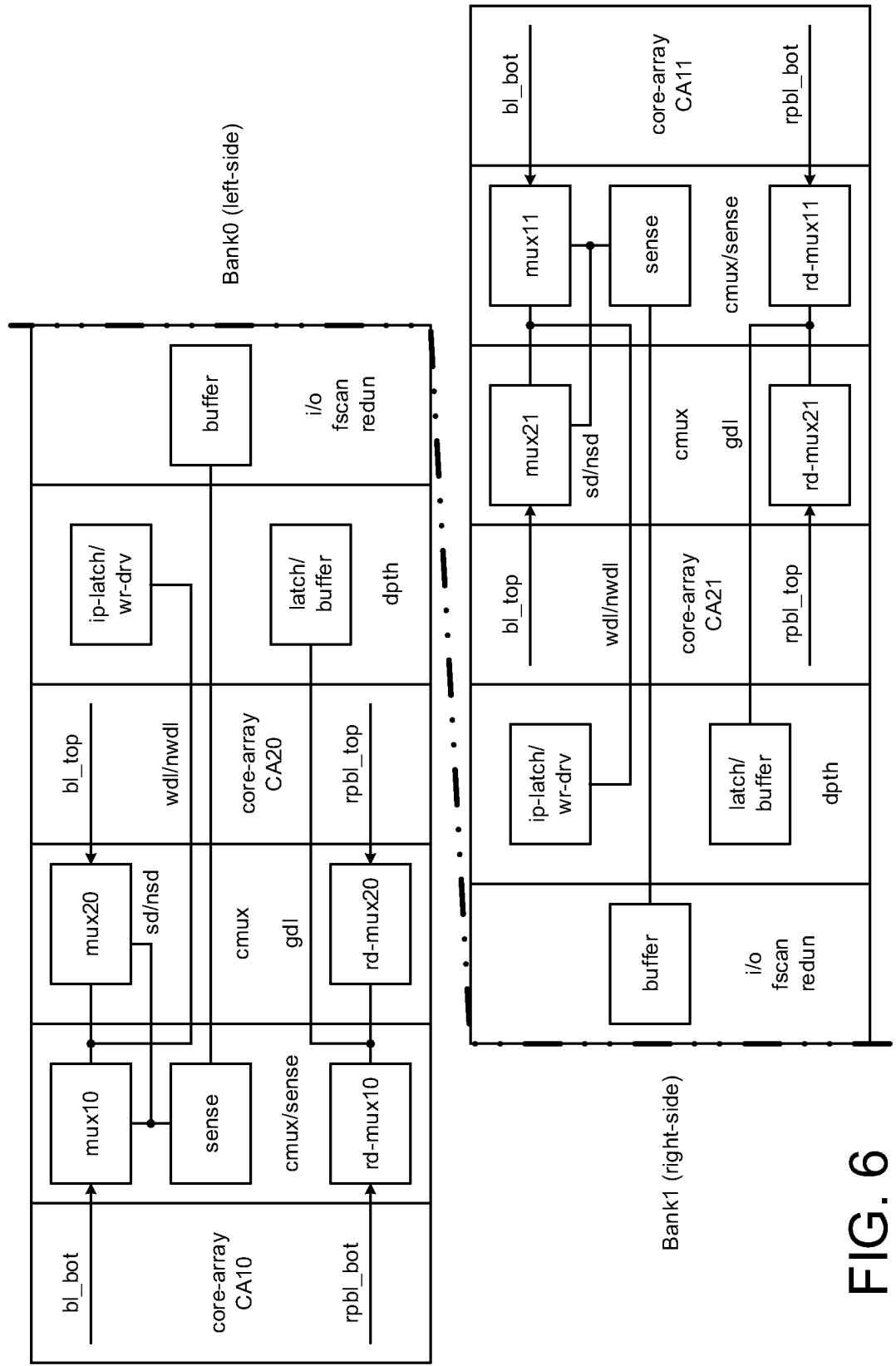
Figure 7:
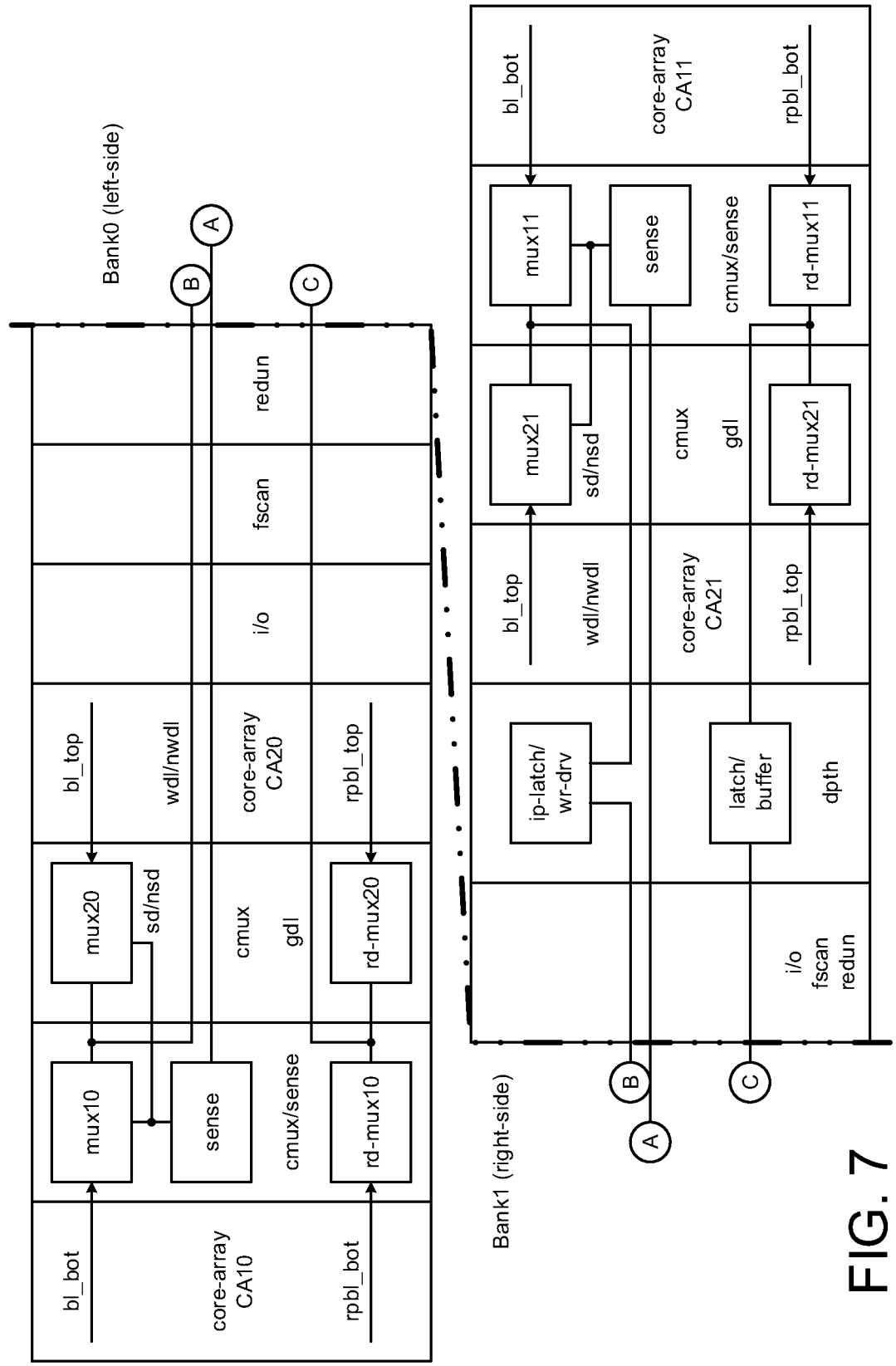

FIGS. 5-7 illustrate various diagrams of flexible-bank memory architecture in accordance with various implementations described herein. In particular, FIG. 5 shows a diagram 500 of flexible-bank memory architecture 504, FIG. 6 shows a diagram 600 of flexible-bank memory architecture 604, and FIG. 7 shows a diagram 700 of flexible-bank memory architecture 704. In some implementations, the flexible-bank (FB) memory architectures 504, 604, 704 may refer to high performance butterfly architecture.

As shown in FIG. 5, the flexible-bank memory architecture 504 may refer to 2P-1R1RW (FB=2) memory architecture having multiple core arrays (CA1, CA2) along with various support circuitry, including, e.g., input-output (i/o), fscan, redundancy (redun) data-path (dpth) that are coupled to core arrays (CA1, CA2) by way of column multiplexer circuitry (cmux/sense, cmux). For instance, core array (CA1) may be coupled to support circuitry via cmux/sense circuitry on a left-side or bottom (bot) of memory 504, and core array (CA2) may be coupled to support circuitry via cmux circuitry on a right-side or top of memory 504. In some implementations, a bottom bitline (bl_bot) may be coupled to write data lines (wdl/nwdl) via a first mux (mux1) that is also coupled to sense amplifier (sense), and also, the sense amplifier (sense) may be coupled to sense data lines (sd/nsd). Also, a bottom read port bitline (rpbl_bot) may be coupled to global data line (gdl) via a first read mux (rd-mux1). Also, in some instances, a top bitline (bl_top) may be coupled to the write data lines (wdl/nwdl) via a second mux (mux2) that is also coupled to sense amplifier (sense) via the sense data lines (sd/nsd). Also, a top read port bitline (rpbl_top) may be coupled to the global data line (gdl) via a second read mux (rd-mux2). Further, an input latch and write driver (ip-latch/wr-drv) may be coupled to the write data lines (wdl/nwdl), and a latch/buffer may be coupled to the global data line (gdl).

As shown in FIG. 6, the flexible-bank memory architecture 604 may refer to 2P-1R1RW (FB=1/2) memory architecture with multiple banks (Bank0, Bank1) and with multiple core arrays (CA10, CA20, CA11, CA21) along with support circuitry, including, e.g., input-output (i/o), fscan, redundancy (redun) data-path (dpth) that are coupled to the multiple core arrays (CA10, CA20, CA11, CA21) by way of column multiplexer circuitry (cmux/sense, cmux). Also, a first bank (Bank0) may include multiple core arrays (CA10, CA20) on a left-side of FB memory 604, and a second bank (Bank1) may include multiple core arrays (CA11, CA21) on a right-side of FB memory 604.

In various implementations, the core array (CA10) of Bank0 may be coupled to the support circuitry via cmux/sense circuitry on a bottom (bot) tier of memory 604, and the core array (CA20) of Bank0 may be coupled to the support circuitry via cmux circuitry on a top tier of memory 604. Also, a bottom bitline (bl_bot) may be coupled to write data lines (wdl/nwdl) via a first mux (mux10) that is also coupled to sense amplifier (sense), and also, the sense amplifier (sense) may be coupled to sense data lines (sd/nsd) and to a buffer in the i/o, fscan, redun. Also, a bottom read port bitline (rpbl_bot) may be coupled to global data line (gdl) via a first read mux (rd-mux10). Further, in some instances, a top bitline (bl_top) may be coupled to the write data lines (wdl/nwdl) via second mux (mux20) that is also coupled to sense amplifier (sense) via the sense data lines (sd/nsd). Also, a top read port bitline (rpbl_top) may be coupled to the global data line (gdl) via a second read mux (rd-mux20). In addition, in various multi-bank applications, an input latch and write driver (ip-latch/wr-drv) may be coupled to the write data lines (wdl/nwdl), and also, a latch/buffer may be coupled to the global data line (gdl).

In various implementations, the core array (CA11) of Bank1 may be coupled to the support circuitry via cmux/sense circuitry on a bottom (bot) tier of memory 604, and the core array (CA20) of Bank0 may be coupled to the support circuitry via cmux circuitry on a top tier of memory 604. Also, a bottom bitline (bl_bot) may be coupled to write data lines (wdl/nwdl) via a first mux (mux11) that is also coupled to sense amplifier (sense), and also, the sense amplifier (sense) may be coupled to sense data lines (sd/nsd) and to a buffer in the i/o, fscan, redun. Also, a bottom read port bitline (rpbl_bot) may be coupled to global data line (gdl) via a first read mux (rd-mux11). Further, in some instances, a top bitline (bl_top) may be coupled to the write data lines (wdl/nwdl) via second mux (mux21) that is also coupled to sense amplifier (sense) via the sense data lines (sd/nsd). Also, a top read port bitline (rpbl_top) may be coupled to the global data line (gdl) via second read mux (rd-mux21). In addition, in various multi-bank applications, an input latch and a write driver (ip-latch/wr-drv) may be coupled to the write data lines (wdl/nwdl), and a latch/buffer may be coupled to the global data line (gdl).

As shown in FIG. 7, the flexible-bank memory architecture 704 may refer to 2P-1R1RW (FB=4) memory architecture with multiple banks (Bank0, Bank1) and with multiple core arrays (CA10, CA20, CA11, CA21) along with support circuitry, including, e.g., input-output (i/o), fscan, redundancy (redun) data-path (dpth) that are coupled to the multiple core arrays (CA10, CA20, CA11, CA21) by way of column multiplexer circuitry (cmux/sense, cmux). Also, a first bank (Bank0) may include multiple core arrays (CA10, CA20) on a left-side of FB memory 704, and a second bank (Bank1) may include multiple core arrays (CA11, CA21) on a right-side of FB memory 704. In some instances, Bank0 may be coupled to Bank1 via interconnect path points (A, B, C).

In various implementations, the core array (CA10) of Bank0 may be coupled to the support circuitry via cmux/sense circuitry on a bottom (bot) tier of memory 704, and the core array (CA20) of Bank0 may be coupled to the support circuitry via cmux circuitry on a top tier of memory 704. Also, a bottom bitline (bl_bot) may be coupled to write data lines (wdl/nwdl) via a first mux (mux10) that is also coupled to sense amplifier (sense), and also, the sense amplifier (sense) may be coupled to sense data lines (sd/nsd). Also, a bottom read port bitline (rpbl_bot) may be coupled to global data line (gdl) via a first read mux (rd-mux10). Further, in some instances, a top bitline (bl_top) may be coupled to the write data lines (wdl/nwdl) via second mux (mux20) that is also coupled to sense amplifier (sense) via the sense data lines (sd/nsd). Also, a top read port bitline (rpbl_top) may be coupled to the global data line (gdl) via a second read mux (rd-mux20). In addition, an input latch and write driver (ip-latch/wr-drv) may be coupled to write data lines (wdl/nwdl), and a latch/buffer may be coupled to the global data line (gdl).

In various implementations, the core array (CA11) of Bank1 may be coupled to the support circuitry via cmux/sense circuitry on a bottom (bot) tier of memory 704, and the core array (CA20) of Bank0 may be coupled to the support circuitry via cmux circuitry on a top tier of memory 704. Also, a bottom bitline (bl_bot) may be coupled to write data lines (wdl/nwdl) via a first mux (mux11) that is also coupled to sense amplifier (sense), and also, the sense amplifier (sense) may be coupled to sense data lines (sd/nsd). Also, a bottom read port bitline (rpbl_bot) may be coupled to global data line (gdl) via a first read mux (rd-mux11). Further, in some instances, a top bitline (bl_top) may be coupled to the write data lines (wdl/nwdl) via second mux (mux21) that is also coupled to sense amplifier (sense) via the sense data lines (sd/nsd). Also, a top read port bitline (rpbl_top) may be coupled to the global data line (gdl) via second read mux (rd-mux21). In addition, an input latch and write driver (ip-latch/wr-drv) may be coupled to the write data lines (wdl/nwdl), and a latch/buffer may be coupled to the global data line (gdl).

Described herein are various implementations of a device with memory circuitry having multi-port bitcells, wherein each bitcell of the multi-port bitcells may include a read-write port and a read port. The device may have read-write circuitry coupled to the read-write port, wherein the read-write circuitry may have write-drive logic and read-sense logic that provide for at least one write and at least one read in a single clock cycle.

Described herein are various implementations of a device with memory circuitry having multi-port bitcells, wherein each bitcell of the multi-port bitcells may include a read-write port and three or more read ports. In some instances, the device may have read-write circuitry coupled to the read-write port, wherein the read-write circuitry may include write-drive logic and read-sense logic that provide for at least one write and three or more reads in a single clock cycle.

Described herein are various implementations of a device with multi-bank memory architecture having multiple banks with each bank of the multiple banks having multi-port bitcells. In some instances, each bitcell of the multi-port bitcells may include a read-write port and a read port. In some instances, each bitcell of the multi-port bitcells may include read-write logic that is coupled to the read-write port of each bitcell, wherein the read-write logic includes write-drive logic and read-sense logic that provide for at least one read and at least one write in a single clock cycle for each bitcell.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
   memory circuitry having multi-port bitcells, wherein each bitcell of the multi-port bitcells has a read-write port and a read port; and
   read-write circuitry coupled to the read-write port, wherein the read-write circuitry comprises:
   a column multiplexer coupled to the read-write port; and
   write-drive logic and read-sense logic that provide for at least one write and at least one read in a single clock cycle, wherein the write-drive logic comprises a write driver coupled to the column multiplexer, and wherein the read-sense logic comprises a first sense amplifier coupled to the column multiplexer.

2. The device of claim 1, wherein:
   the write-drive logic further comprises an input latch coupled to the column multiplexer;
   the read-sense logic further comprises a second sense amplifier coupled to the read port; or
   combinations thereof.

3. The device of claim 1, wherein:
   the write-drive logic and the read-sense logic provide for multiple reads in the single clock cycle,
   the read-write port has first port transistors that are configured to use the read-sense logic to perform a first read of the multiple reads in the single clock cycle, and the read port has second port transistors that are configured to perform a second read of the multiple reads in the single clock cycle.

4. The device of claim 3, wherein:
each bitcell of the multi-port bitcells has eight transistors (8T),
the first port transistors include six transistors (6T) for each bitcell, and
the second port transistors include two transistors (2T) for each bitcell.

5. The device of claim 1, wherein:
the read-write port has first port transistors that are configured to use the write-drive logic to perform the at least one write in the single clock cycle, and
the read port has second port transistors that are configured to perform the at least one read in the single clock cycle.

6. The device of claim 5, wherein:
each bitcell of the multi-port bitcells has eight transistors (8T),
the first port transistors include six transistors (6T) for each bitcell, and
the second port transistors include two transistors (2T) for each bitcell.

7. The device of claim 1, wherein the memory circuitry is configured for use with a cache memory architecture in computing applications involving a central processing unit (CPU), and wherein the multi-port bitcells are static random access memory (SRAM) bitcells that are configured for dual-port memory applications.

8. A device comprising:
multi-bank memory architecture having multiple banks with each bank of the multiple banks having multi-port bitcells, wherein each bitcell of the multi-port bitcells has a read-write port and a read port; and
read-write circuitry coupled to the read-write port of each bitcell of the multi-port bitcells, wherein the read-write circuitry has write-drive logic and read-sense logic that provide for at least one write and three or more reads in a single clock cycle using the multiple banks.

9. The device of claim 8, wherein the write-drive logic and the read-sense logic provide for multiple reads in the single clock cycle.

10. The device of claim 9, wherein:
the read-write port has first port transistors that are configured to use the read-sense logic to perform first reads of the multiple reads in the single clock cycle, and
the read port has second port transistors that are configured to perform second reads of the multiple reads in the single clock cycle.

11. The device of claim 10, wherein:
each bitcell of the multi-port bitcells has eight transistors (8T),
the first port transistors include six transistors (6T) for each bitcell, and
the second port transistors include two transistors (2T) for each bitcell.

12. The device of claim 8, wherein:
the read-write port has first port transistors that are configured to use the write-drive logic to perform the at least one write in the single clock cycle, and
the read port has second port transistors that are configured to perform the three or more reads in the single clock cycle.

13. The device of claim 12, wherein:
each bitcell of the multi-port bitcells has eight transistors (8T),
the first port transistors include six transistors (6T) for each bitcell, and
the second port transistors include two transistors (2T) for each bitcell.

14. The device of claim 8, wherein the multi-bank memory architecture is configured for use for a cache memory architecture in computing applications involving a central processing unit (CPU), and wherein the multi-port bitcells are static random access memory (SRAM) bitcells that are configured for multi-port memory applications.

15. A device comprising:
multi-bank memory architecture having multiple banks with each bank of the multiple banks having multi-port bitcells, wherein each bitcell of the multi-port bitcells has a read-write port and a read port; and
read-write circuitry coupled to the read-write port of each bitcell, wherein the read-write circuitry comprises:
one or more column multiplexers coupled to the read-write port of each bitcell; and
write-drive logic and read-sense logic that provide for at least one read and at least one write in a single clock cycle for each bitcell, wherein the write-drive logic comprises one or more write drivers coupled to the one or more column multiplexers, and wherein the read-sense logic comprises one or more first sense amplifiers coupled to the one or more column multiplexers.

16. The device of claim 15, wherein;
the write-drive logic further comprises one or more input latches coupled to the one or more column multiplexers;
the read-sense logic further comprises one or more second sense amplifiers coupled to the read port of each bitcell; or
combinations thereof.

17. The device of claim 15, wherein:
the write-drive logic and the read-sense logic provide for multiple reads in the single clock cycle for each bitcell,
the read-write port for each bitcell has first port transistors that are configured to use the read-sense logic to perform a first read of the multiple reads in the single clock cycle, and
the read port for each bitcell has second port transistors that are configured to perform a second read of the multiple reads in the single clock cycle.

18. The device of claim 17, wherein:
each bitcell of the multi-port bitcells has eight transistors (8T),
the first port transistors include six transistors (6T) for each bitcell, and
the second port transistors include two transistors (2T) for each bitcell.

19. The device of claim 15, wherein:
the read-write port for each bitcell has first port transistors that are configured to use the write-drive logic to perform the at least one write in the single clock cycle, and
the read port for each bitcell has second port transistors that are configured to perform the at least one read in the single clock cycle.

20. The device of claim 19, wherein:
each bitcell of the multi-port bitcells has eight transistors (8T),
the first port transistors include six transistors (6T) for each bitcell, and the second port transistors include two transistors (2T) for each bitcell.

\* \* \* \* \*